United States Patent
Hashimoto

(10) Patent No.: US 6,727,144 B2
(45) Date of Patent: Apr. 27, 2004

(54) MANUFACTURING METHOD FOR SEMICONDUCTOR STORAGE DEVICE

(75) Inventor: Jun Hashimoto, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/284,107

(22) Filed: Oct. 31, 2002

(65) Prior Publication Data

US 2003/0235951 A1 Dec. 25, 2003

(30) Foreign Application Priority Data

Jun. 21, 2002 (JP) ........................................ 2002-182040

(51) Int. Cl.[7] .................. H01L 21/336; H01L 21/3205
(52) U.S. Cl. ........................................ 438/257; 438/593
(58) Field of Search ................................ 438/257, 262, 438/264, 201, 211, 593, 594

(56) References Cited

U.S. PATENT DOCUMENTS

| | | | | |
|---|---|---|---|---|
| 5,029,130 A | * | 7/1991 | Yeh | ......................... 365/185.31 |
| 5,414,286 A | * | 5/1995 | Yamauchi | ................... 257/315 |
| 6,284,596 B1 | * | 9/2001 | Sung et al. | .................. 438/257 |
| 6,329,685 B1 | | 12/2001 | Lee | |
| 6,369,420 B1 | | 4/2002 | Yeh et al. | |
| 6,563,167 B2 | * | 5/2003 | Chern | ......................... 257/316 |
| 6,621,115 B2 | * | 9/2003 | Jenq et al. | ................... 257/314 |

FOREIGN PATENT DOCUMENTS

JP       2000-216273       8/2000

* cited by examiner

*Primary Examiner*—Michael Trinh
(74) *Attorney, Agent, or Firm*—Rabin & Berdo, PC

(57) ABSTRACT

A manufacturing method for a semiconductor storage device with a floating gate includes a first step for depositing a first thermally-oxidized film (14) on a poly-silicon film (12) that has been etched to a desired depth so as to have a tapered etched end by using a silicon nitride film (13) having an opening as a mask, a step for depositing a first NSG film side wall spacer (115) that covers the tapered portion on an opening side wall of the silicon nitride film (13) and adding heat treatment thereto, a step for forming a second NSG film side wall spacer (15) on the inner side of the first NSG film side wall spacer 115, a step for forming a poly-silicon plug (18), then depositing a second thermally-oxidized film (19) on the poly-silicon plug (18), a step for removing the silicon nitride film (13), then etching the poly-silicon film (12), and a step for removing the first NSG film side wall spacer (115).

6 Claims, 8 Drawing Sheets

US 6,727,144 B2

MANUFACTURING METHOD FOR SEMICONDUCTOR STORAGE DEVICE

BACKGROUND OF THE INVENTION

1. Field of the Invention

The present invention relates to semiconductor storage device and, more particularly, to the formation of a floating gate of a flash memory.

2. Description of Related Art

A flash memory is a nonvolatile memory capable of retaining stored data even after its power is turned OFF. The cell structure of the flash memory widely varies, but basically includes a MOS transistor having a double gate structure in which a floating gate is provided between a control gate and a silicon substrate.

The storing mechanism is such that the voltage of the control gate at which current starts to flow into a memory cell differs depending on whether electrons are present or absent in the floating gate. The different voltages allow 1 and 0 of logic data to be stored. The floating gate is in a floating state, being fully surrounded by an insulating film; therefore, when the power is turned OFF after electrons are electrically charged into or discharged from the floating gate, the electrons in the floating gate do not leak out or no additional electrons enter the floating gate. This is the mechanism of a nonvolatile memory.

One of the wide variety of cell structures is shown in FIG. 6. In the cell structure, a source line diffusion layer 57 and a drain line diffusion layer 77 are formed on a silicon substrate, and a floating gate 65 and a word line 70 providing a control gate are formed through the intermediary of a gate oxide film 51. The word line 70 is isolated from the floating gate 65 through the intermediary of a tunnel oxide film 69 and a thermally-oxidized film 54. A source line 68 is formed on the source line diffusion layer 57. The portion of the floating gate 65 that opposes the word line 70 has a pointed distal end. Hereinafter, the pointed end portion of the floating gate 65 will be referred to simply as a pointed portion 60.

In the flash memory of this type having the structure described above, in a writing mode, the source is set to 0 volt, while the drain and the word line are set at a high voltage. This causes electrons to flow from the source to the drain at a high electric field, generating hot electrons capable of crossing over the energy barrier from a silicon surface to an oxide film in the vicinity of the drain. The hot electrons are drawn by the high voltage of the word line into the floating gate. In an erasing mode, a voltage is applied to the word line shown in FIG. 6 to concentrate electric charges at the pointed portions of the floating gate to draw out electrons from the floating gate.

Hence, in the flash memory having such a structure, it is important to form the pointed portion of the floating gate with high accuracy and stability. The pointed portion considered to be most preferable has an angle of about 45 degrees and a height of about 20 nm to 30 nm.

FIG. 7 illustrates a conventional process for forming the pointed portion. An 8 nm-thick gate oxide film 51, an 80 nm-thick poly-silicon film 52, and a 300 nm-thick silicon nitride film 53 are formed in this sequence on a silicon substrate 50. Using a photoresist, a floating gate and the region planned for a source are formed on the silicon nitride film 53 by patterning. This is used as the mask to dry-etch the silicon nitride film 53 by a dry-etching apparatus, and the resist is ashed by an ashing apparatus, as shown in FIG. 7A.

Then, by using the etched silicon nitride film 53 as a mask, the poly-silicon film 52 is etched to a depth of about 30 nm at a tapering angle of 45 degrees by, for example, a downflow, microwave type etching apparatus under a condition of a 0.5-Torr pressure, an etching gas $CF_4/O_2$=100/30 sccm, an 800-W microwave power, a 60° C. lower electrode, and a 15-second etching time (refer to FIG. 7B).

Subsequently, a thermally-oxidized film 54 of about 6 nm is deposited at 850° C. on the front surface of the poly-silicon film 52, as shown in FIG. 7C. Then, a TEOS (tetraethoxysilane)-NSG (non-doped silicate glass) film of about 180 nm is deposited on the entire surface by the LPCVD method, and an NSG spacer 55 is formed by a dry etching apparatus, as shown in FIG. 8A. Furthermore, the poly-silicon film 52 is etched by a dry etching apparatus by using the silicon nitride film 53 and the NSG spacer 55 as the masks, as shown in FIG. 8B.

Thereafter, the TEOS-NSG film is formed to a thickness of about 60 nm on the entire surface by the LPCVD process, and an NSG spacer 56 is formed by a dry etching apparatus. The gate oxide film 51 is etched, then a source diffusion region 57 is formed by ion implantation, as shown in FIG. 8C. Next, a poly-silicon film is deposited on the entire surface, and etched back by a dry etching apparatus to form a poly-silicon plug 58. Thereafter, a thermally-oxidized film 59 having a thickness of about 10 nm is deposited on the front surface of the poly-silicon plug 58 at 850° C., as shown in FIG. 8D. Next, the oxide film is removed from the front surface of the silicon nitride film 53 with, for example, a 5% hydrofluoric acid solution, for 45 seconds, then the silicon nitride film 53 is removed by applying, for example, hot phosphoric acid ($H_3PO_4$) of 150° C. for about 4000 seconds (30% over-etching), as shown in FIG. 9A.

In the following step, by using the NSG spacer 56 and the thermally-oxidized film 59 as the masks, the poly-silicon film 52 is dry-etched to form the pointed portion 60 (FIG. 9B) by, for example, an ICP type (inductively-coupled plasma type) dry-etching apparatus in three steps, namely, a 1st step (a 5-mTorr pressure, an etching gas $Cl_2$=50 sccm, a 250W source power, a 150W bottom power, a 75° C. lower electrode temperature, a 5-second etching time), a 2nd step (a 5-mTorr pressure, an etching gas $HBr/O_2$=100/1 sccm, a 200W source power, a 50W bottom power, a 75° C. lower electrode temperature, EPD), and a 3rd step (a 60-mTorr pressure, an etching gas $HBr/O_2/He$=100/1/100 sccm, a 250W source power, a 70W bottom power, a 75° C. lower electrode temperature, 15-second etching time).

According to the method described above, however, the NSG spacer 56 is retreated sideways by the over-etching when the silicon nitride film 53 is removed by the hot phosphoric acid. During the following process in which the poly-silicon film 52 is dry-etched, the pointed portion 60 is exposed without being covered by the NSG spacer 56. This has been posing a problem in that the pointed portion 60 is undesirably etched, resulting in a defective shape or an insufficient height of the pointed portion 60.

To prevent the NSG spacer 56 from being retreated, there is a method in which the NSG spacer 56 is annealed to make it denser so as to lower the etching rate. However, the temperature increases toward the front surface of the NSG spacer, so that the film quality inevitably differs between the inside and the front surface of the spacer, presenting a problem in that the NSG spacer is defectively shaped due to the over-etching for the removal by hot phosphoric acid, as shown in FIG. 10.

SUMMARY OF THE INVENTION

The present invention has been made with a view toward solving the problems with the conventional manufacturing method for a semiconductor storage device, and it is an object of the present invention to provide a novel, improved manufacturing method for a semiconductor storage device that allows a pointed portion to be stably formed as it is originally designed without the danger of being deformed due to accidental etching of the pointed portion or being formed with an insufficient height when forming a floating gate of a flash memory.

To this end, according to a first aspect of the present invention, there is provided a manufacturing method for a semiconductor storage device with a floating gate, including: a first step for etching a poly-silicon film by using a silicon nitride film having an opening as a mask thereby to form a tapered portion that provides a pointed portion of the floating gate later; a second step for depositing a first thermally-oxidized film on the poly-silicon film of the opening of the silicon nitride film; a third step for forming a first NSG film spacer covering the tapered portion of the poly-silicon film on side walls of the opening of the silicon nitride film; a fourth step for adding heat treatment (annealing) to the first NSG film spacer to turn it into a denser film; a fifth step for forming a second NSG film spacer on the inner side of the first NSG film spacer; a sixth step for forming a poly-silicon plug to fill the opening of the silicon nitride film, then depositing a second thermally-oxidized film on the poly-silicon plug; a seventh step for removing only the silicon nitride film; an eighth step for etching the poly-silicon film by using the first NSG film spacer, the second NSG film spacer, and the second thermally-oxidized film as the masks thereby to form a pointed portion of the floating gate; and a ninth step for removing the first NSG film spacer covering the pointed portion.

With this arrangement, the additional NSG spacer for covering the pointed portion is formed on the outer side of the conventional NSG spacer and is annealed, so that the selection ratio of silicon nitride to NSG for hot phosphoric acid etching in the process of removing the silicon nitride film is improved. Moreover, the problem in that the NSG spacer is retreated sideways can be solved; hence, the pointed portion is securely covered in the subsequent step for etching the poly-silicon film to form the pointed portion, thus permitting the pointed portion to be stably formed without being etched.

According to a second aspect of the present invention, there is provided a manufacturing method for a semiconductor storage device with a floating gate, including: a first step for etching a poly-silicon film by using a silicon nitride film having an opening as a mask thereby to form a tapered portion that provides the pointed portion of a floating gate later; a second step for depositing a first thermally-oxidized film on the poly-silicon film of the opening of the silicon nitride film; a third step for forming NSG film spacers on side walls of the opening of the silicon nitride film, then forming a poly-silicon plug to fill the opening of the silicon nitride film, and depositing a second thermally-oxidized film on the poly-silicon plug; a fourth step for removing the silicon nitride film, then depositing an insulating film on the entire surface thereof; a fifth step for forming a spacer of the insulating film that covers the tapered portion of the poly-silicon film on an outer side wall of the NSG film spacer; a sixth step for etching the poly-silicon film by using the insulating film spacer, the NSG film spacer, and the second thermally-oxidized film as the masks thereby to form a pointed portion of the floating gate; and a seventh step for removing the insulating film spacer.

Preferably, the insulating film is a silicon nitride film or an NSG film.

Thus, after the silicon nitride film removing step wherein the NSG spacer is retreated sideways, causing the pointed portion to be exposed, the insulating film spacer that covers the pointed portion is formed on the outer side wall of the NSG spacer. This makes it possible to stably form the pointed portion, preventing the pointed portion from being etched during the poly-silicon etching process.

Moreover, for the NSG spacer for the silicon nitride film or the NSG film used as the insulating film, the selection ratio of poly-silicon to NSG is higher than the selection ratio of poly-silicon to silicon nitride film. This arrangement allows the NSG spacer serving as a mask to have a further stable shape and hence to obtain a good pointed shape when the pointed portion is formed by poly-silicon etching.

According to a third aspect of the present invention, there is provided a manufacturing method for a semiconductor storage device with a floating gate, including: a first step for etching a poly-silicon film under a silicon nitride film by using the silicon nitride film having an opening as a mask thereby to form a tapered portion that provides the floating gate later; a second step for depositing a first thermally-oxidized film on the poly-silicon film of the opening of the silicon nitride film; a third step for forming an NSG film that covers the tapered portion of the poly-silicon film and that has been processed into a dense film by heat treatment on a side wall of the opening of the silicon nitride film; a fourth step for etching an altered layer of the surfaces of the NSG film spacer and the silicon nitride film; a fifth step for forming a poly-silicon plug to fill the opening of the silicon nitride film, then depositing a second thermally-oxidized film on the poly-silicon plug; a sixth step for removing the silicon nitride film; and a seventh step for etching the poly-silicon film by using the NSG film spacer and the second thermally-oxidized film as the masks thereby to form the pointed portion of the floating gate.

Thus, the portions of the surface layers of the NSG spacer and the silicon nitride film at which the rate of etching with hot phosphoric acid is lower because of heat treatment, are removed. This obviates the need for over-etching in the hot phosphoric acid etching process, thus eliminating the cause for forming an NSG spacer with a defective shape. Therefore, a stable pointed shape can be achieved in the subsequent etching process of the poly-silicon film that provides the pointed portion.

Preferably, when the portion of the surface layer of the NSG spacer at which the etching rate is lower, as described above, is removed, the emission intensity of the emission wavelength of CO, which is a main reaction byproduct of the NSG, is monitored to determine the completion of the altered layer produced by carrying out heat treatment of the NSG film side wall spacer. This makes it possible to accommodate variations in film quality and fluctuation in etching rate, permitting further stable shaping of the NSG spacers and a better shape of the pointed portion to be accomplished.

DETAILED DESCRIPTION OF THE PREFERRED EMBODIMENTS

Figure 1A:
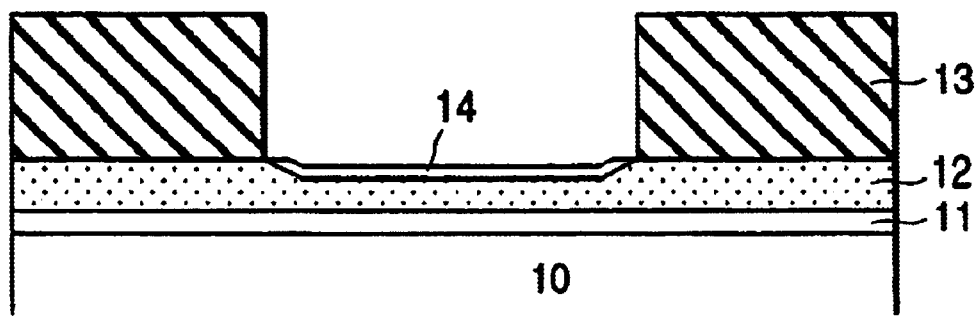
FIGS. 1A through 1C are process sectional views illustrating a gate of a flash memory cell according to a first embodiment of the present invention.

With reference to the accompanying drawings, preferred embodiments of a manufacturing method for a semiconductor storage device in accordance with the present invention will now be described in detail. The components having substantially the same functional constructions will be assigned the same reference numerals in the present specification and drawings so as to avoid repeating the same explanation.

First Embodiment

FIG. 1 illustrates a process for producing a flash memory cell in accordance with a first embodiment. As in the prior art, an 8 nm-thick gate oxide film 11, an 80 nm-thick poly-silicon film 12, and a 300 nm-thick silicon nitride film 13 are formed in this sequence on a silicon substrate 10. Using a photoresist, a floating gate and a region planned for a source are formed on the silicon nitride film 13 by patterning. This is used as the mask to dry-etch the silicon nitride film 13 by a dry-etching apparatus, and the resist is ashed by an ashing apparatus.

Then, by using the silicon nitride film 13 as a mask, the poly-silicon film 12 is etched to a depth of about 30 nm at a tapering angle of 45 degrees by, for example, a downflow, microwave type etching apparatus, which is a type of dry etching apparatuses, under a condition of a 0.5-Torr pressure, an etching gas $CF_4/O_2=100/30$ sccm, an 800-W microwave power, a 60° C. lower electrode, and a 15-second etching time. Furthermore, a thermally-oxidized film 14 of about 6 nm is deposited on the surface of the poly-silicon film 12 at 850° C. (refer to FIG. 1A).

Figure 1B:
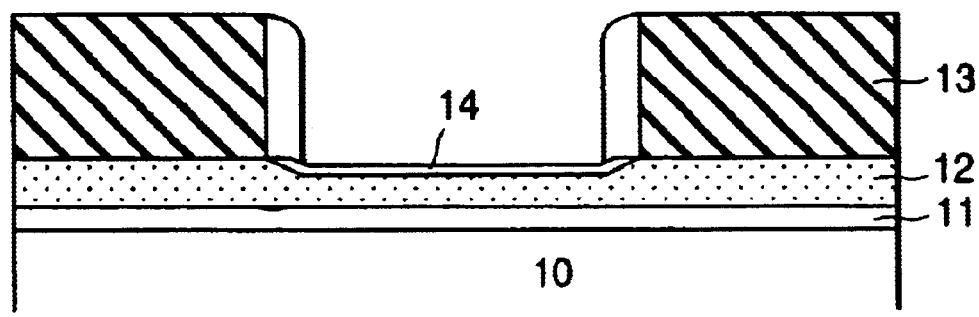
Figure 1C:
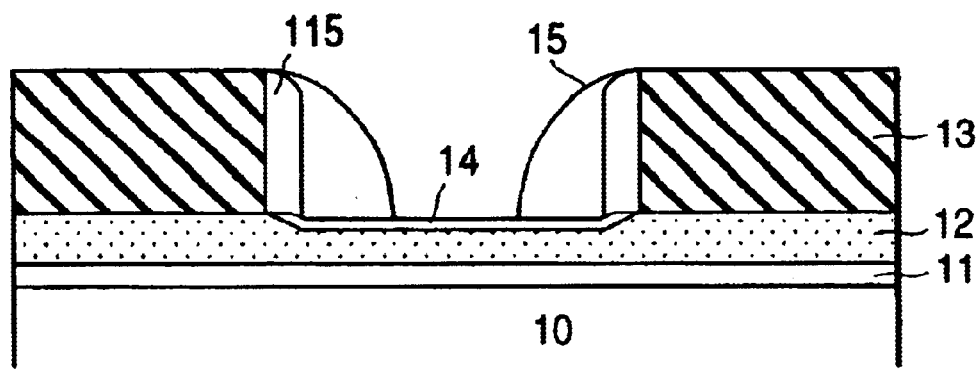

After that, a TEOS-NSG film of about 20 nm is deposited on the entire surface by the LPCVD method. Then, by using, for example, a RIE type dry etching apparatus, the TEOS-NSG film is etched under a condition of a 1000-mTorr pressure, RF power=400W, an etching gas $CHF_3/CF_4/Ar=40/90/900$ sccm, a 0° C. lower electrode temperature, and 10-second etching time. Thus, an NSG spacer 115 that just covers the tapered portion of the poly-silicon film 12, as shown in FIG. 1B.

Figure 2A:
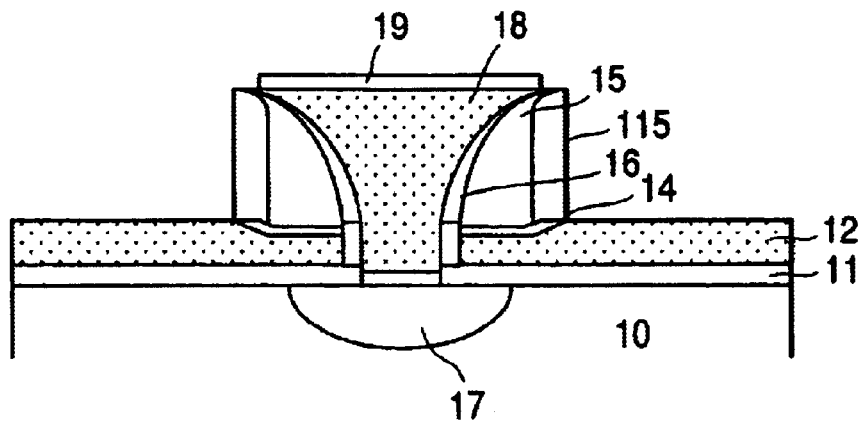
FIGS. 2A through 2C are process sectional views following FIG. 1C illustrating the gate of the flash memory cell according to the first embodiment of the present invention.

In the following step, the film is annealed at about 850° C. An NSG film of about 160 nm is then formed by the LPCVD method, and etched by a dry etching apparatus to form an NSG spacer 15 (see FIG. 1C). The following steps are the same as those of the prior art illustrated in FIGS. 8B through 8D, in which an NSG spacer 16, a source diffusion region 17, a poly-silicon plug 18, and a thermally-oxidized film 19 are formed. Next, the silicon nitride film 13 is removed by applying, for example, a 150° C. hot phosphoric acid for about 4000 seconds (30% over-etching), as shown in FIG. 2A.

Figure 2B:
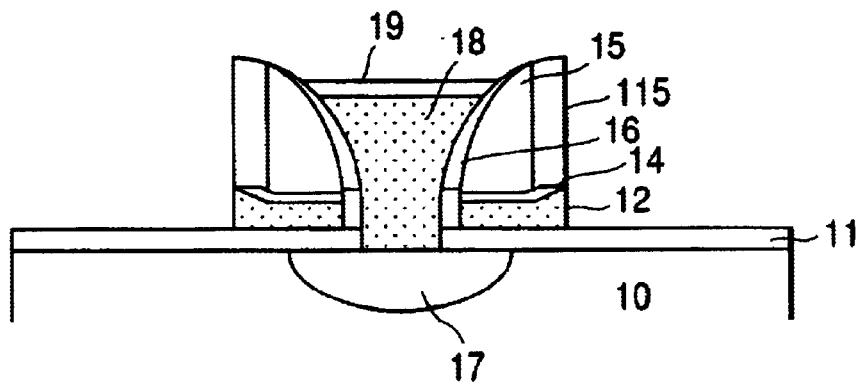

By using the NSG spacers 15 and 115 and the thermally-oxidized film 19 as the masks, the poly-silicon film 12 is dry-etched by, for example, an ICP type (inductively-coupled plasma type) dry-etching apparatus in three steps, namely, a 1st step (a 5-mTorr pressure, an etching gas $Cl_2=50$ sccm, a 250W source power, a 150W bottom power, a 75° C. lower electrode temperature, a 5-second etching time), a 2nd step (a 5-mTorr pressure, an etching gas $HBr/O_2=100/1$ sccm, a 200W source power, a 50W bottom power, a 75° C. lower electrode temperature, EPD), and a 3rd step (a 60-mTorr pressure, an etching gas $HBr/O_2/He=100/1/100$ sccm, a 250W source power, a 70W bottom power, a 75° C. lower electrode temperature, 15-second etching time). Thus, the pointed portion is formed, as illustrated in FIG. 2B.

Figure 2C:
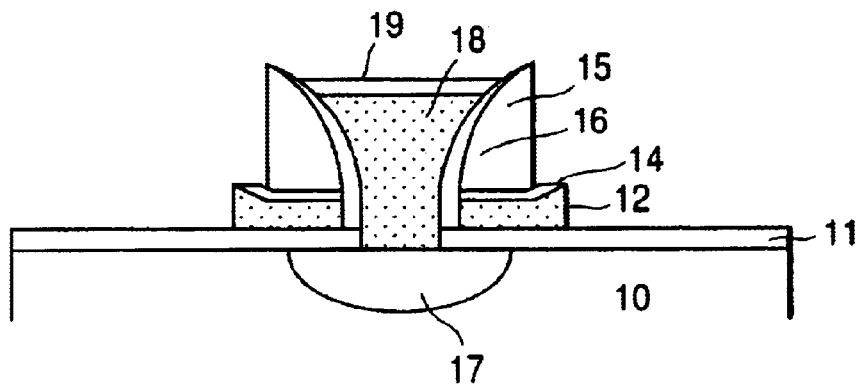

In the first step of the three steps of the above etching process, the natural oxide film on the surface of the poly-silicon film is removed. In the second step, the poly-silicon film is vertically etched, and in the third step, the poly-silicon remaining on the stepped portion of a foundation layer is removed. Thereafter, the NSG spacer is removed by, for example, a 5% hydrofluoric acid, for 40 seconds so as to obtain the pointed portion, as illustrated in FIG. 2C.

As described above, the NSG spacer 115 is formed and annealed so as to improve the selection ratio of silicon nitride to NSG in the hot phosphoric acid etching process for removing the silicon nitride film. The NSG spacer covers the pointed portion without retreating sideways, thus ensuring stable shaping of the pointed portion in the subsequent poly-silicon film etching process for forming the pointed portion.

Second Embodiment

FIG. 3 illustrates a method for producing a flash memory cell according to a second embodiment. The same steps as those of the prior art are carried out up to the point where the silicon nitride film is removed. A gate oxide film 21, a poly-silicon film 22, and a silicon nitride film are deposited in this order on a silicon substrate 20, and the poly-silicon film 22 is etched to have a tapering angle of 45 degrees. A thermally-oxidized film 24 is deposited on the surface of the poly-silicon film 22, then an NSG spacer 25 is formed. After etching the poly-silicon film 22, an NSG spacer 26 is formed. The gate oxide film 21 is etched, then a source diffusion region 27 is formed. After a poly-silicon plug 28 is formed, a thermally-oxidized film 29 is deposited, then the silicon nitride film is removed.

Figure 3A:
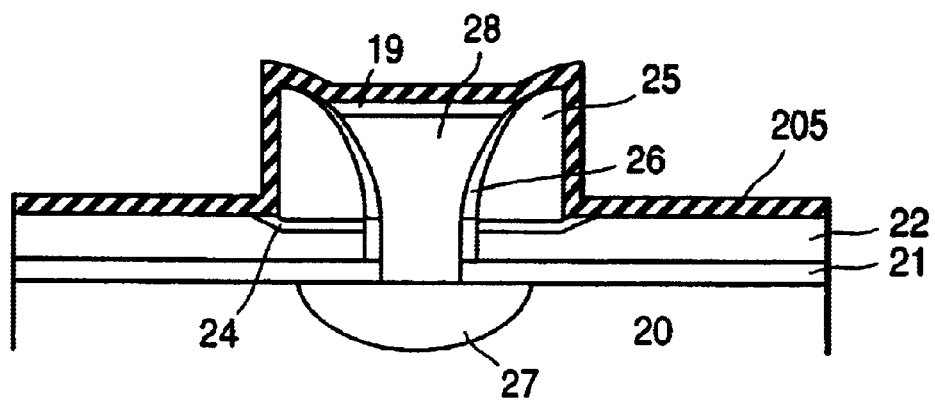
FIGS. 3A through 3C are process sectional views illustrating a gate of a flash memory cell according to a second embodiment of the present invention.
Figure 3B:
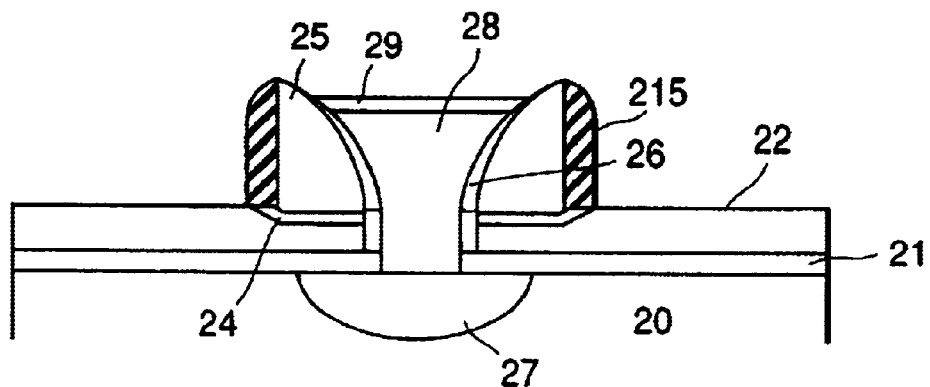
Figure 6:
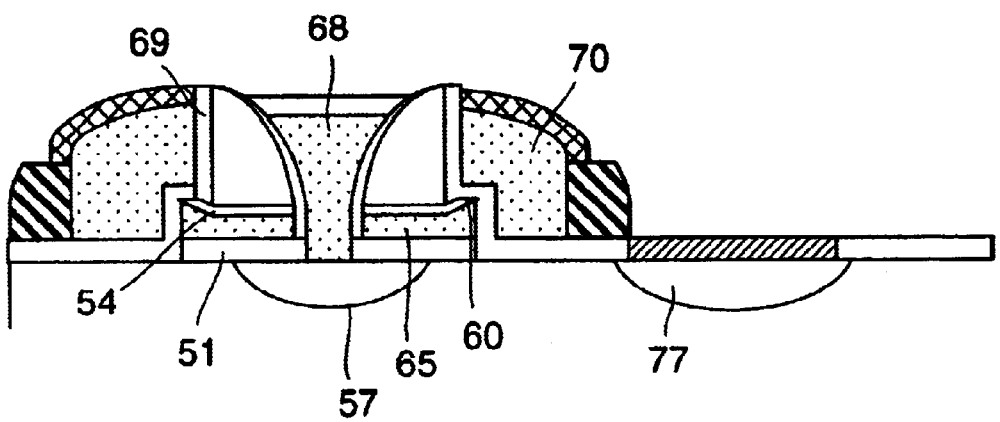
FIG. 6 is a sectional view showing a flash memory cell according to a prior art.
Figure 7A:
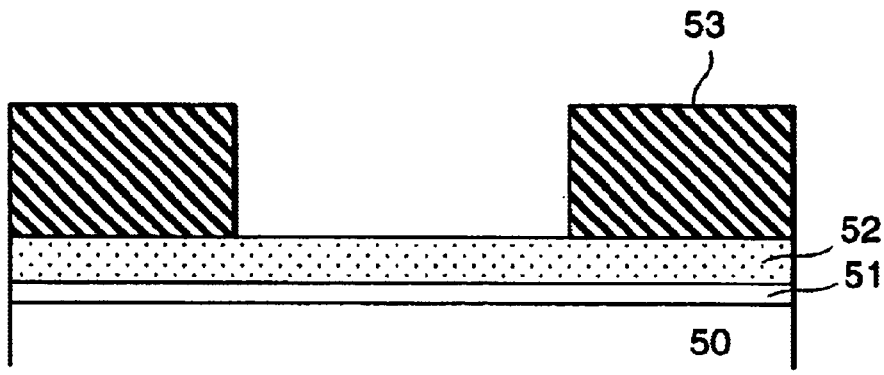
FIGS. 7A through 7C are process sectional views of a gate of the flash memory cell according to the prior art.
Figure 7B:
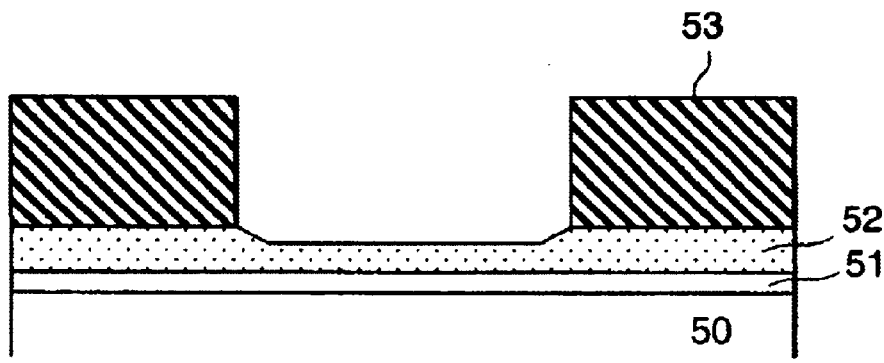
Figure 7C:
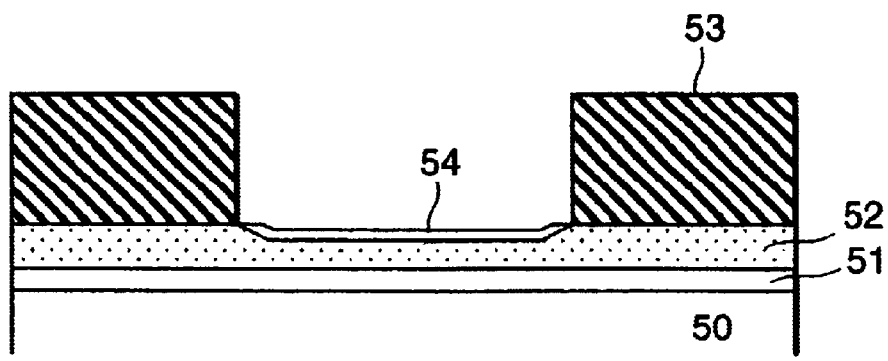

FIG. 3A illustrates a state wherein a silicon nitride film 205 is deposited to about 20 nm by the LPCVD method on the entire surface after the state in the prior art shown in FIG. 6. Thereafter, by using, for example, a RIE type dry etching apparatus, a silicon nitride film spacer 215 is formed under a condition of a 1000-mTorr pressure, RF power=400W, etching gas $CHF_3/CF_4/Ar=40/90/900$ sccm, a 0° C. lower electrode temperature, and 15-second etching time (see FIG. 3B).

Figure 3C:
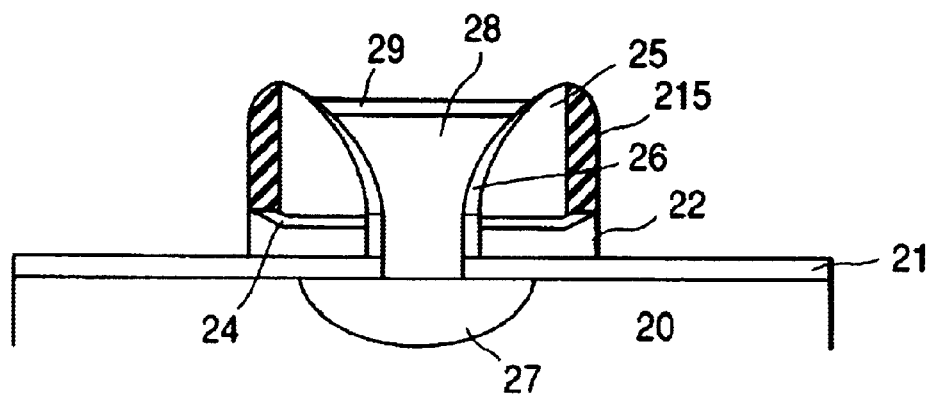

Subsequently, using the silicon nitride film spacer 215, the NSG spacer 25, and the thermally-oxidized film 29 as the masks, dry etching is carried out under the same conditions as those in the prior art to etch the poly-silicon film 22 thereby to form the pointed portion, as shown in FIG. 3C. Thereafter, the silicon nitride film spacer 215 is removed by applying a 150° C. hot phosphoric acid for about 240 seconds.

Thus, according to this embodiment, after the silicon nitride film is removed, the silicon nitride film spacers are formed on both outer side walls of the NSG spacer to cover the pointed portions. This ensures stable shaping of the pointed portions during the poly-silicon etching process for forming the pointed portions, as in the case of the first embodiment.

Third Embodiment

FIG. 4 illustrates a method for producing a flash memory cell according to a third embodiment. The same steps as those of the prior art are carried out up to the point illustrated in FIG. 8C. A gate oxide film 31, a poly-silicon film 32, and a silicon nitride film 33 are deposited in this order on a silicon substrate 30, and the poly-silicon film 32 is etched to have a tapering angle of 45 degrees. A thermally-oxidized film 34 is deposited on the surface of the poly-silicon film 32, then an NSG spacer 35 is formed. After etching the poly-silicon film 32, an NSG spacer 36 is formed. The gate oxide film 31 is etched, then a source diffusion region 37 is formed, and a poly-silicon plug 38 is formed.

Figure 4A:
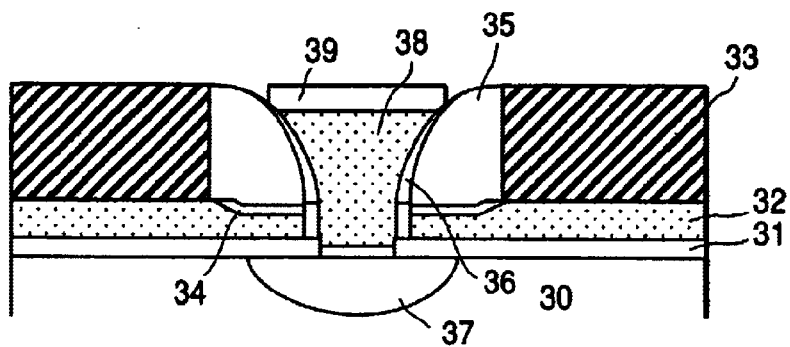
FIGS. 4A through 4D are process sectional views illustrating a gate of a flash memory cell according to a third embodiment of the present invention.
Figure 4B:
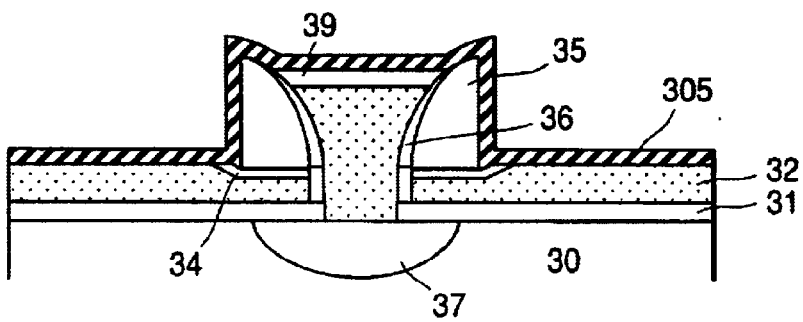

Subsequently, a thermally-oxidized film 39 is deposited to 30 nm on the poly-silicon plug 38, as shown in FIG. 4A. Then, a TEOS-NSG film 305 is deposited to 20 nm by the LPCVD method in the third embodiment (see FIG. 4B), while the silicon nitride film is deposited in the second embodiment.

Figure 4C:
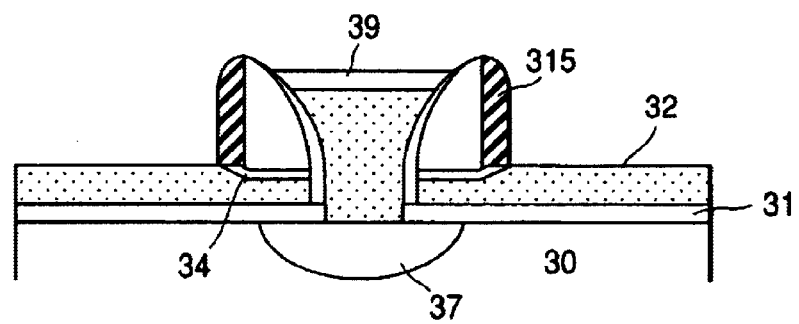
Figure 4D:
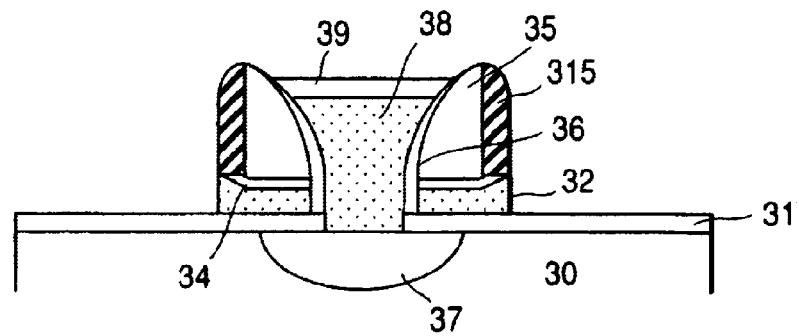

Thereafter, by using, for example, a RIE type dry etching apparatus, the TEOS-NSG film 305 is etched under a condition of a 1000-mTorr pressure, RF power=400W, etching gas $CHF_3/CF_4/Ar=40/90/900$ sccm, a 0° C. lower electrode temperature, and 10-second etching time to form an NSG spacer 315 (see FIG. 4C). Subsequently, using the NSG spacer 315, the NSG spacer 35, and the thermally-oxidized film 39 as the masks, the poly-silicon film 32 is etched using the same dry etching apparatus and under the same conditions as those in the prior art (see FIG. 4D). Thereafter, the NSG spacer 315 is removed by applying, for example, a 5% hydrofluoric acid for about 30 seconds so as to form the pointed portions.

In the third embodiment, the NSG spacers are used in place of the silicon nitride film spacers in the second embodiment. This leads to a higher selection ratio of NSG to poly-silicon, so that the NSG spacers are not etched and retreated. Thus, further stable shaping of the pointed portions can be achieved.

Fourth Embodiment

FIG. 5 illustrates a method for producing a flash memory cell according to a fourth embodiment. A gate oxide film 41, a poly-silicon film 42, and a silicon nitride film 43 are deposited in this order on a silicon substrate 40, and the poly-silicon film 42 is etched into a shape with a tapering angle of 45 degrees. A thermally-oxidized film 44 is deposited on the surface of the poly-silicon film 42, then an NSG film is formed on the entire surface by the CVD method, and annealed. Subsequently, an NSG spacer 45 is formed by dry etching.

Figure 5A:
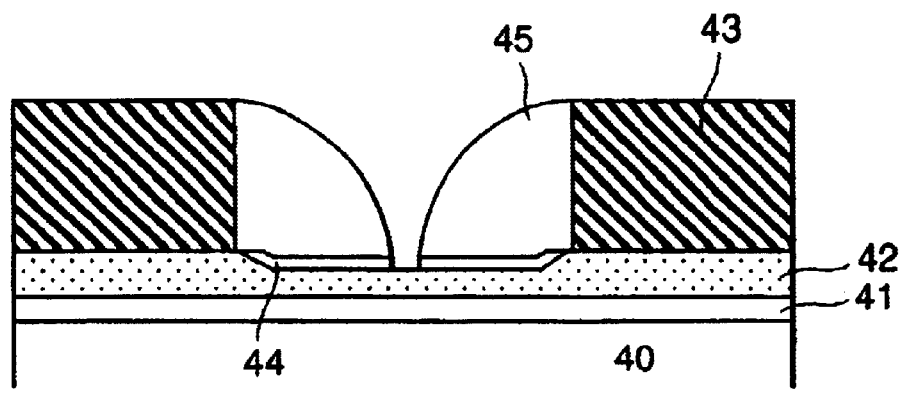
FIGS. 5A and 5B are process sectional views illustrating a gate of a flash memory cell according to a fourth embodiment of the present invention.
Figure 5B:
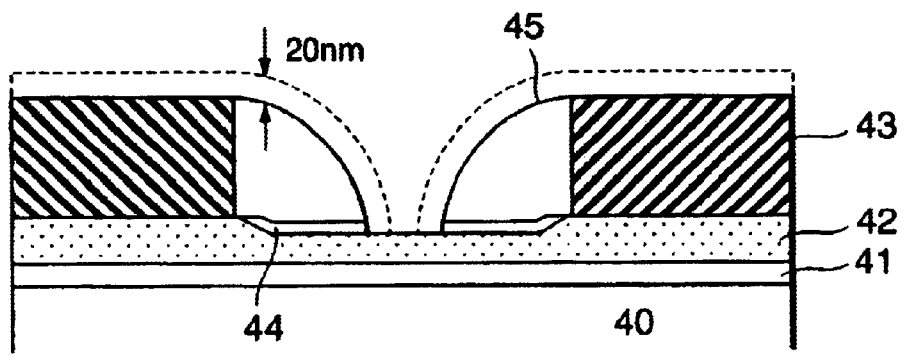
Figure 8A:
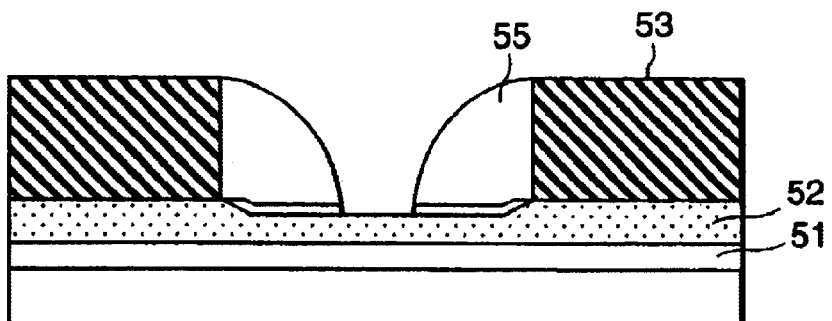
FIGS. 8A through 8D are process sectional views following FIG. 7C of the gate of the flash memory cell according to the prior art.
Figure 8B:
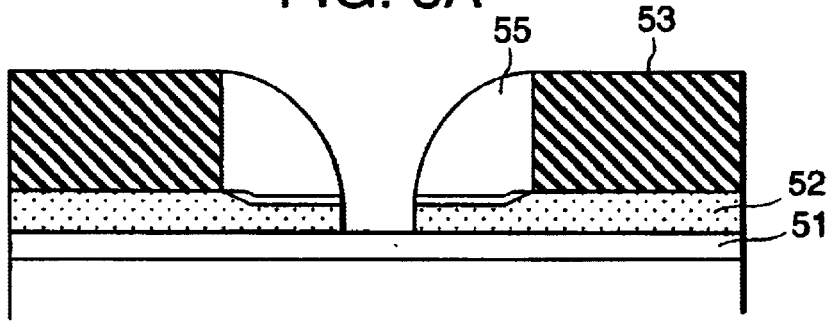
Figure 8C:
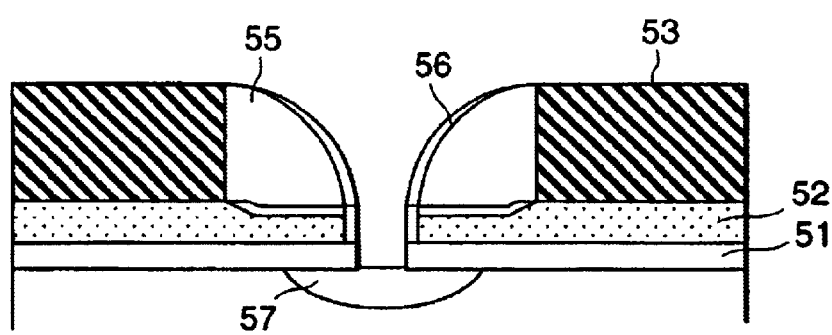
Figure 8D:
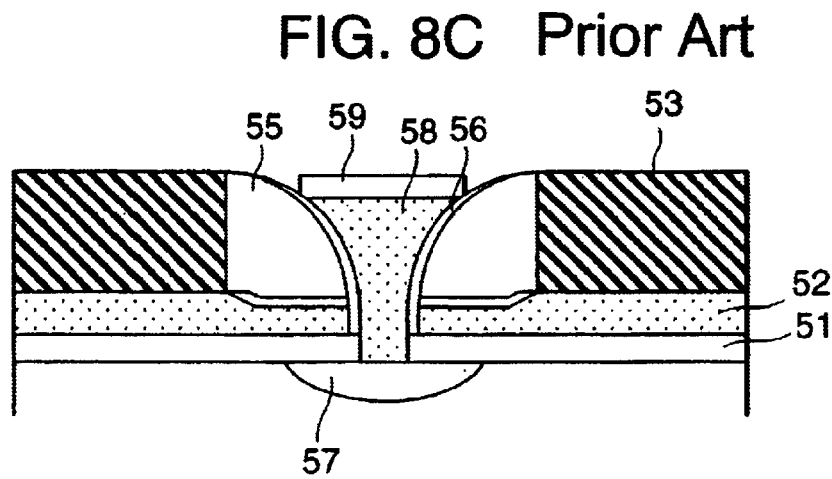
Figure 9A:
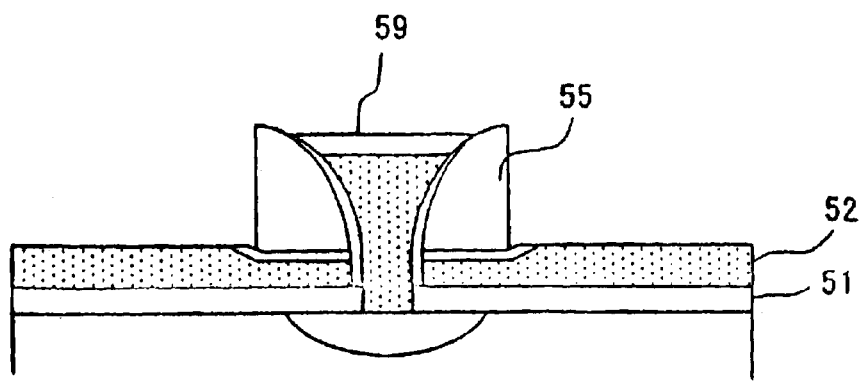
FIGS. 9A and 9B are process sectional views following FIG. 8D of the gate of the flash memory cell according to the prior art.
Figure 9B:
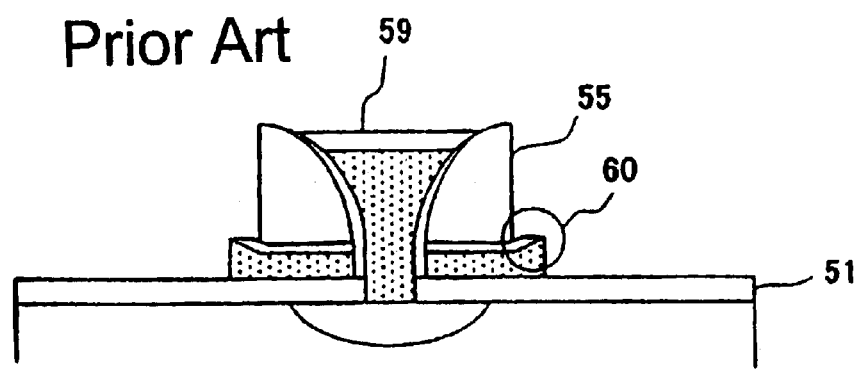
Figure 10:
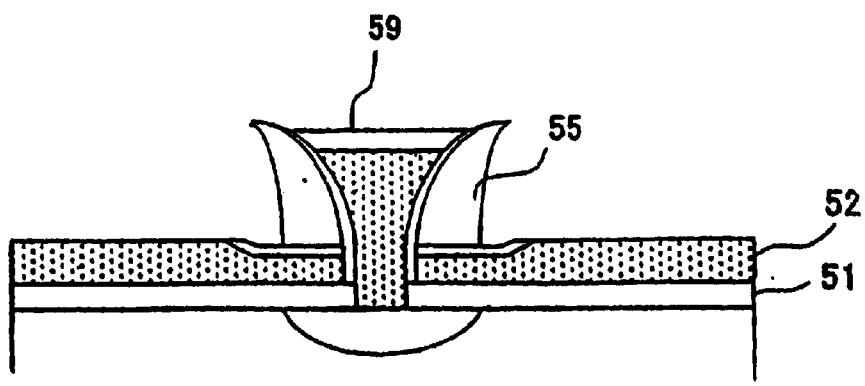
FIG. 10 is a process sectional view of the gate of the flash memory cell according to the prior art, in which an NSG spacer in FIG. 9A has been deformed.

In a state illustrated in FIG. 5A wherein a silicon nitride film 43 is 320 nm thick and the NSG spacer 45 is 0.20 μm in the foregoing prior art shown in FIG. 8A, the surface layer of the NSG spacer 45 is etched by 20 nm by, for instance, an isotropic chemical etcher under a condition where selection ratios of NSG/silicon nitride=1 and NSG/poly-silicon= 2, e.g., 20-Torr pressure, RF power=700W, etching gas $C_2F_6/O_2 =100/9000$ sccm, 250° C. electrode temperature, and a 30-second etching time (see FIG. 5B). After that, the same steps as those in the second and third embodiments are carried out.

Thus, the altered layer portion of the surface layer of the NSG spacer 45 that has been annealed by heat and exhibits a lower hot phosphoric acid etching rate is removed by dry etching. This prevents the NSG spacers from being deformed by over-etching that follows the hot phosphoric acid etching. Hence, the NSG spacers remain covering the pointed portions, allowing stable shaping of the pointed ends in the subsequent process for etching the poly-silicon film.

Fifth Embodiment

In this embodiment, during the process for etching by the isotropic chemical etcher in the fourth embodiment, the emission intensity of the emission wavelength (e.g., the wavelength of 440 nm) of CO, which is a main reaction byproduct of the NSG, is monitored to determine the end of the etching of the slow etching rate portion of the surfaces of the NSG spacers.

By determining the end by monitoring emission waveforms, it is possible to accommodate variations in film quality and fluctuation in etching rate. As a result, over-etching when etching the silicon nitride film by hot phosphoric acid can be minimized, and further stable shaping of the NSG spacers can be realized, thus allowing further stable shaping of the pointed portion to be accomplished.

The preferred embodiments of the manufacturing method for a semiconductor device in accordance with the present invention have been described with reference to the accompanying drawings. The present invention, however, is not limited to the embodiments. Various changes and modifications can be made within the technological spirit and scope of the present invention described in the appended claims will become apparent to persons skilled in the art, and are deemed to be automatically embraced in the technological scope of the present invention.

As described above, according to the present invention, to form a floating gate of the type in which a voltage is applied to a control gate to concentrate electric charges in the pointed end portions of the floating gate so as to draw out electrons from the floating gate in a flash memory in an erase mode, the pointed end portions are covered by NSG spacers or silicon nitride film spacers to protect them from being etched when removing the poly-silicon film around the floating gate by dry etching. With this arrangement, the pointed portion can be stably formed with high accuracy as originally designed. This permits the flash memory to perform stable erasing operation with consequent higher reliability of the device incorporating the flash memory.

What is claimed is:

1. A manufacturing method for a semiconductor storage device with a floating gate, comprising:

a first step for etching a poly-silicon film by using a silicon nitride film having an opening as a mask thereby to form a tapered portion that provides the floating gate later;

a second step for depositing a first thermally-oxidized film on the poly-silicon film of the opening of the silicon nitride film;

a third step for forming a first NSG film spacer covering the tapered portion of the poly-silicon film on a side wall of the opening of the silicon nitride film;

a fourth step for adding heat treatment to the first NSG film spacer to turn it into a denser film;

a fifth step for forming a second NSG film spacer on the inner side of the first NSG film spacer;

a sixth step for forming a poly-silicon plug to fill the opening of the silicon nitride film, then depositing a second thermally-oxidized film on the poly-silicon plug;

a seventh step for removing only the silicon nitride film;

an eighth step for etching the poly-silicon film by using the first NSG film spacer, the second NSG film spacer, and the second thermally-oxidized film as the masks; and a ninth step for removing the first NSG film spacer.

2. A manufacturing method for a semiconductor storage device with a floating gate, comprising:

a first step for etching a poly-silicon film under a silicon nitride film by using the silicon nitride film having an opening as a mask thereby to form a tapered portion that provides the floating gate later;

a second step for depositing a first thermally-oxidized film on the poly-silicon film of the opening of the silicon nitride film;

a third step for forming an NSG film spacer on a side wall of the opening of the silicon nitride film, then forming a poly-silicon plug to fill the opening of the silicon nitride film, and depositing a second thermally-oxidized film on the poly-silicon plug;

a fourth step for removing the silicon nitride film, then depositing an insulating film on the entire surface thereof;

a fifth step for forming a spacer of the insulating film that covers the tapered portion of the poly-silicon film on an outer side wall of the NSG film spacer;

a sixth step for etching the poly-silicon film by using the insulating film spacer, the NSG film spacer, and the second thermally-oxidized film as the masks; and a seventh step for removing the insulating film spacer.

3. The manufacturing method for a semiconductor storage device according to claim 2, wherein the insulating film is a silicon nitride film in the first step.

4. The manufacturing method for a semiconductor storage device according to claim 2, wherein the insulating film is an NSG film in the first step.

5. A manufacturing method for a semiconductor storage device with a floating gate, comprising:

a first step for etching a poly-silicon film under a silicon nitride film by using the silicon nitride film having an opening as a mask thereby to form a tapered portion that provides the floating gate later;

a second step for depositing a first thermally-oxidized film on the poly-silicon film of the opening of the silicon nitride film;

a third step for forming an NSG film spacer that covers the tapered portion of the poly-silicon film and that has been processed into a dense film by heat treatment on a side wall of the opening of the silicon nitride film;

a fourth step for etching an altered layer of the surfaces of the NSG film spacer and the silicon nitride film;

a fifth step for forming a poly-silicon plug to fill the opening of the silicon nitride film, then depositing a second thermally-oxidized film on the poly-silicon plug;

a sixth step for removing the silicon nitride film; and a seventh step for etching the poly-silicon film by using the NSG film spacer and the second thermally-oxidized film as the masks.

6. The manufacturing method for a semiconductor storage device according to claim 5, wherein the emission intensity of the NSG film during etching is monitored to determine the completion of the altered layer produced by carrying out heat treatment of the NSG film side wall spacer in the step.

* * * * *